(12) United States Patent
Meiser et al.

(10) Patent No.: US 11,705,506 B2
(45) Date of Patent: Jul. 18, 2023

(54) LATERAL TRENCH TRANSISTOR DEVICE

(71) Applicant: Infineon Technologies Dresden GmbH & Co. KG, Dresden (DE)

(72) Inventors: Andreas Peter Meiser, Sauerlach (DE); Till Schloesser, Munich (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 101 days.

(21) Appl. No.: 17/228,928

(22) Filed: Apr. 13, 2021

(65) Prior Publication Data
US 2021/0234023 A1 Jul. 29, 2021

Related U.S. Application Data

(63) Continuation of application No. 16/657,697, filed on Oct. 18, 2019, now Pat. No. 11,018,244.

(60) Provisional application No. 62/748,070, filed on Oct. 19, 2018.

(51) Int. Cl.
*H01L 29/66* (2006.01)
*H01L 21/225* (2006.01)
*H01L 21/768* (2006.01)

(52) U.S. Cl.
CPC ...... *H01L 29/66704* (2013.01); *H01L 21/225* (2013.01); *H01L 21/76877* (2013.01); *H01L 29/66696* (2013.01)

(58) Field of Classification Search
CPC ............. H01L 29/66704; H01L 21/225; H01L 21/76877; H01L 29/66696; H01L 29/407; H01L 29/66659; H01L 29/41766; H01L 29/7835; H01L 21/2255

USPC ......................................................... 438/268
See application file for complete search history.

(56) References Cited

U.S. PATENT DOCUMENTS

| 5,637,898 | A | * | 6/1997 | Baliga | H01L 29/7813 |
| | | | | | 257/330 |
| 7,633,120 | B2 | * | 12/2009 | Hebert | H01L 29/66704 |
| | | | | | 257/341 |
| 9,006,820 | B2 | * | 4/2015 | Tsuchiko | H01L 29/66712 |
| | | | | | 257/334 |
| 9,570,545 | B2 | * | 2/2017 | Dong | H01L 27/0922 |
| 9,859,418 | B2 | | 1/2018 | Meiser et al. | |
| 11,018,244 | B2 | * | 5/2021 | Meiser | H01L 21/225 |
| 2012/0306009 | A1 | * | 12/2012 | Kim | H01L 29/7806 |
| | | | | | 257/334 |

(Continued)

*Primary Examiner* — Vu A Vu
(74) *Attorney, Agent, or Firm* — Murphy, Bilak & Homiller, PLLC

(57) ABSTRACT

A method of manufacturing a semiconductor device includes: forming a trench in a first side of a semiconductor layer, the semiconductor layer including a drift zone of a first conductivity; forming a drain region of the first conductivity type in the first side of the semiconductor layer and laterally adjoining the drift zone; forming a body region of a second conductivity type opposite the first conductivity type and laterally adjoining the drift zone at a side of the drift zone opposite the drain region; and forming source regions of the first conductivity type and body contact regions of the second conductivity type in a sidewall of the trench and arranged in an alternating manner along a length of the trench, using a dopant diffusion process which includes diffusing dopants of both conductivity types from oppositely-doped dopant source layers which are in contact with different regions of the sidewall.

23 Claims, 22 Drawing Sheets

(56) References Cited

U.S. PATENT DOCUMENTS

2017/0047443 A1* 2/2017 Meiser ................ H01L 29/1083
2019/0115430 A1* 4/2019 Tsubomi ............. H01L 29/4238

* cited by examiner

LATERAL TRENCH TRANSISTOR DEVICE

BACKGROUND

A relevant figure of merit for transistors used many types of applications such as automotive is Ron×A×cost, where Ron is the on-state resistance of the device and A is area. Dual-poly dense trench technology is limited by cell pitch based on a given field oxide thickness for a certain voltage class and mesa width. Shrinking the mesa width is an option for reducing Ron, but there is a trade-off between mesa shrink and mobility loss, i.e., smaller mesa area has higher doping but lower mobility. Another device concept is a lateral trench transistor cell with a vertical drain or source connection to the backside of the die (chip). With this concept, more semiconductor volume is used per unit of area. However, the related process costs are higher than for a standard dual poly trench transistor. Also, the degree to which Ron can be further lowered is limited by implantation depth. The implantation depth limitations apply to the body region and also the tilted n+/p+ implants used to form the source and body contact regions in the sidewall of the body contact/source trench. The angle of the titled implant limits the aspect ratio of the body contact/source trench, and the ion implantation energy limits the depth at which the source and body contact regions can be formed in the sidewall of the body contact/source trench.

Hence, there is a need for a deep lateral trench transistor device with improved figure of merit.

SUMMARY

According to an embodiment of a method of manufacturing a semiconductor device, the method comprises: forming a trench in a first side of a semiconductor layer, the semiconductor layer including a drift zone of a first conductivity; forming a drain region of the first conductivity type in the first side of the semiconductor layer and laterally adjoining the drift zone; forming a body region of a second conductivity type opposite the first conductivity type and laterally adjoining the drift zone at a side of the drift zone opposite the drain region; and forming source regions of the first conductivity type and body contact regions of the second conductivity type in a sidewall of the trench and arranged in an alternating manner along a length of the trench, using a dopant diffusion process which includes diffusing dopants of both conductivity types from oppositely-doped dopant source layers which are in contact with different regions of the sidewall.

Diffusing dopants of both conductivity types from oppositely-doped dopant source layers may comprise: forming a first dopant source layer along the sidewall and a bottom of the trench, the first dopant source layer containing a dopant species of the second conductivity type; after forming the first dopant source layer, filling the trench with a photoresist bilayer stack; structuring the photoresist bilayer stack selective to the first dopant source layer to expose vertical stripes of the first dopant source layer in an upper part of the trench and which are spaced apart from one another by the structured photoresist bilayer stack along the length of the trench; removing the exposed vertical stripes of the first dopant source layer from the upper part of the trench to expose vertical stripes of the trench sidewall; after removing the exposed vertical stripes of the first dopant source layer, removing the structured photoresist bilayer stack from the trench; forming a second dopant source layer in contact with the exposed vertical stripes of the trench sidewall, the second dopant source layer containing a dopant species of the first conductivity type; and diffusing the dopant species of the second conductivity type from the first dopant source layer into first regions of the trench sidewall in contact with the first dopant source layer, and diffusing the dopant species of the first conductivity type from the second dopant source layer into second regions of the trench sidewall in contact with the second dopant source layer.

Separately or in combination, the first conductivity type may be n-type, the second conductivity type may be p-type, the first dopant source layer may comprise boron-doped silicate glass, and the second dopant source layer may comprise a phosphorous-doped silicate glass.

Separately or in combination, the structured photoresist bilayer stack may comprise silicon comprising resist and the exposed vertical stripes of the first dopant source layer may be removed from the upper part of the trench using an etchant which is selective to the silicon comprising resist.

Separately or in combination, the first conductivity type may be p-type, the second conductivity type may be n-type, the first dopant source layer may comprise phosphorous-doped silicate glass, and the second dopant source layer may comprise boron-doped silicate glass.

Separately or in combination, structuring the photoresist bilayer stack selective to the first dopant source layer may comprise: forming a lithography mask within the photoresist bilayer stack; patterning the lithography mask into stripes which extend along a first surface of the semiconductor layer at the first side in a direction transverse to the length of the trench, so that regions of the photoresist bilayer stack in the trench are uncovered by the patterned lithography mask; and recessing the regions of the photoresist bilayer stack in the trench uncovered by the patterned lithography mask.

Separately or in combination, the method may further comprise: after the diffusing, removing the first dopant source layer and the second dopant source layer from the trench; and after removing the first dopant source layer and the second dopant source layer from the trench, filling the trench with an electrically conductive material which is in direct contact with the source regions and the body contact regions along the length of the trench.

Separately or in combination, diffusing dopants of both conductivity types from oppositely-doped dopant source layers may comprise: forming a first dopant source layer along the sidewall and a bottom of the trench, the first dopant source layer containing a dopant species of the second conductivity type; forming an etch mask layer on the first dopant source layer, the etch mask layer having a different etch selectivity than the first dopant source layer; after forming the first dopant source layer and the etch mask layer, filling the trench with a filling material; structuring the filling material and the etch mask layer selective to the first dopant source layer to expose vertical stripes of the first dopant source layer in an upper part of the trench and which are spaced apart from one another by the structured filling material and the structured etch mask layer along the length of the trench; removing the structured filling material to expose the etch mask layer in a lower portion of the trench; after removing the structured filling material, removing the exposed vertical stripes of the first dopant source layer from the upper part of the trench to expose vertical stripes of the trench sidewall; forming a second dopant source layer in contact with the exposed vertical stripes of the trench sidewall, the second dopant source layer containing a dopant species of the first conductivity type; and diffusing the dopant species of the second conductivity type from the first dopant source layer into first regions of the trench sidewall in contact with the first dopant source layer, and diffusing the dopant species of the first conductivity type from the second dopant source layer into second regions of the trench sidewall in contact with the second dopant source layer.

Separately or in combination, the filling material may comprise polysilicon or metal, and the etch mask layer may comprise silicon nitride.

Separately or in combination, structuring the filling material and the etch mask layer selective to the first dopant source layer may comprise: forming a lithography mask over a first surface of the semiconductor layer at the first side, the lithography mask covering the filling material and the etch mask layer; patterning the lithography mask into stripes which extend along the first surface of the semiconductor layer and over the filling material and the etch mask layer in a direction transverse to the length of the trench, so that regions of the filling material and the etch mask layer in the trench are uncovered by the patterned lithography mask; and recessing the regions of the filling material and the etch mask layer in the trench uncovered by the patterned lithography mask.

Separately or in combination, the method may further comprise: after the diffusing, removing the first dopant source layer and the second dopant source layer from the trench; and after removing the first dopant source layer and the second dopant source layer from the trench, filling the trench with an electrically conductive material which is in direct contact with the source regions and the body contact regions along the length of the trench.

Separately or in combination, forming the body region may comprise: forming a hard mask with an opening on a first surface of the semiconductor layer at the first side; etching the drift zone through the opening in the hard mask to form a trench in the drift zone; and filling the trench in the drift zone with an epitaxial material having the second conductivity type.

Separately or in combination, the drift zone may be etched until reaching an epitaxial layer of the second conductivity type on which the drift zone is formed.

Separately or in combination, the method may further comprise: forming a vertical contact trench which extends through a central part of the epitaxial material and into a doped substrate disposed under the semiconductor layer; and filling the vertical contact trench with an electrically conductive material which electrically connects the source regions to the doped substrate.

Separately or in combination, the method may further comprise: forming a vertical contact trench which extends through the body region and into a doped substrate of the second conductivity type disposed under the semiconductor layer; and filling the vertical contact trench with an electrically conductive material which electrically connects the source regions to the doped substrate.

Separately or in combination, the method may further comprise: forming a vertical contact trench which extends through the drain region and into a doped substrate of the first conductivity type disposed under the semiconductor layer; and filling the vertical contact trench with an electrically conductive material which electrically connects the drain region to the doped substrate.

According to an embodiment of a method of manufacturing a semiconductor device, the method comprises: forming a trench in a first side of a semiconductor layer, the semiconductor layer including a drift zone of a first conductivity; forming a drain region of the first conductivity type in the first side of the semiconductor layer and laterally adjoining the drift zone; forming a hard mask with an opening on a first surface of the semiconductor layer at the first side; etching the drift zone through the opening in the hard mask to form a trench in the drift zone; filling the trench in the drift zone with an epitaxial material having the second conductivity type to form a body region which laterally adjoins the drift zone at a side of the drift zone opposite the drain region; forming source regions of the first conductivity type and body contact regions of the second conductivity type in a sidewall of the trench and arranged in an alternating manner along a length of the trench; and forming a vertical contact structure which extends through the body region or the drain region and into a doped substrate of the first conductivity type disposed under the semiconductor layer, the vertical contact structure electrically connecting the source regions or the drain region to the doped substrate.

The source regions and the body contact regions may be formed using a dopant diffusion process which includes diffusing dopants of both conductivity types from oppositely-doped dopant source layers which are in contact with different regions of the trench sidewall.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a semiconductor device having a lateral trench transistor cell construction with a vertical drain or source connection to the backside of the die (chip). The source and body contact regions of the lateral trench transistor cell are formed in the sidewall of the body contact/source trench using a dopant diffusion process instead of an ion implantation process. This way, the depth at which the source and body contact regions can be formed is not subject to ion implantation limitations, allowing for higher aspect ratio trenches and deeper source and body contact regions. For example, aspect (height-to-width) ratios of 2-1, 5-1, 10-1 or even higher can be realized. Such high aspect ratio trenches make available more semiconductor volume per unit of area.

Figure 1:
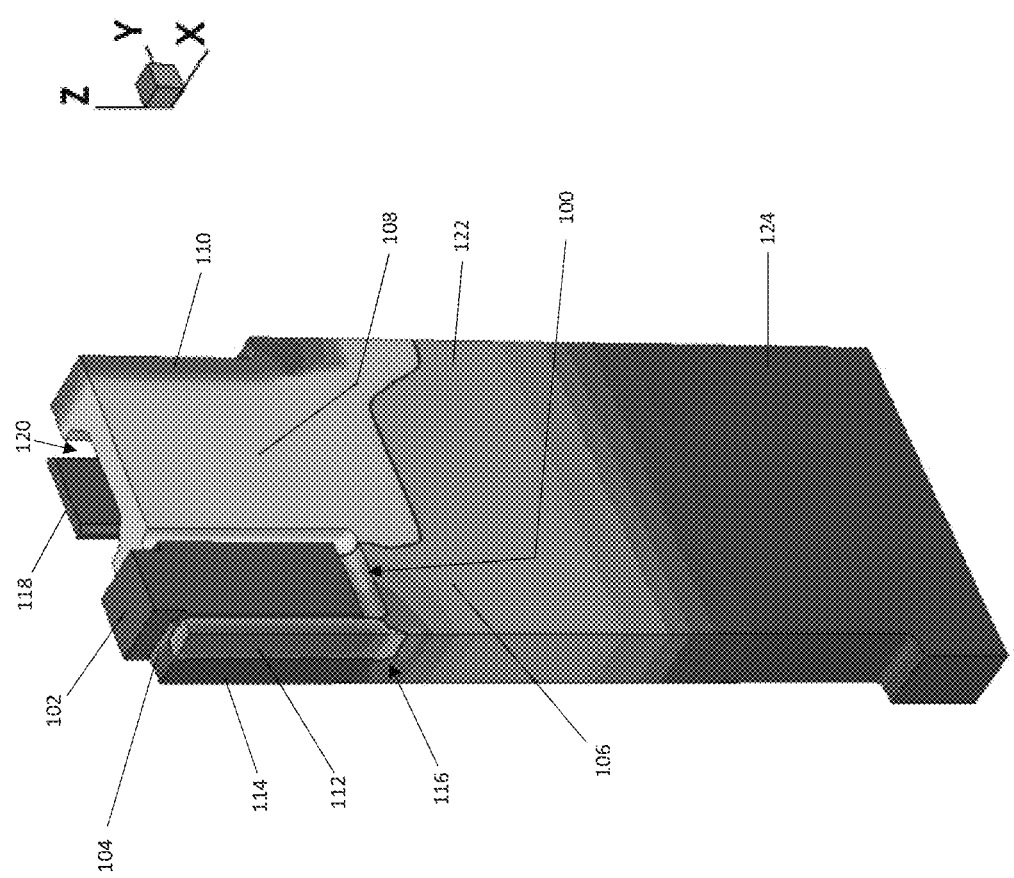
FIG. 1 illustrates a partial perspective view of a semiconductor device having a lateral trench transistor cell construction.

FIG. 1 illustrates a partial perspective view of a semiconductor device having a lateral trench transistor cell construction. The semiconductor device includes a gate trench 100 with a gate electrode 102 for controlling a channel region 104 of the device. The gate dielectric is not shown for ease of illustration. A drift zone 108 of the device adjoins a drain (collector) region 110 at an opposite side of the drift zone 108 as the channel region 104. The channel region 104 connects the drain region 110 to a source (emitter) region 112 under control of a voltage applied to the gate electrode 102. The terms "source" and "emitter" are used interchangeably herein as are the terms "drain" and "collector", to indicate that the semiconductor device may be a MOSFET (metal-oxide-semiconductor field-effect transistor), HEMT (high-electron mobility transistor), IGBT (insulated gate bipolar transistor) or similar type of transistor device.

The source region 112 and a body (bulk) contact region 114 are formed in the sidewall of a body contact/source trench 116. The partial perspective view of FIG. 1 shows one source region 112/body contact region 114 pair. However, the device may actually include a plurality of the source regions 112 and a plurality of the body contact regions 114 formed in the sidewall of the body contact/source trench 116 and arranged in an alternating manner (source, body contact, source, body contact, . . . ) along a length of the trench 116 (direction X). The source regions 112 and the body contact regions 114 may be shaped as stripes which extend lengthwise along the height (depth) of the body contact/source trench 116 (direction Z).

The source and body contact regions 112, 114 of the lateral trench transistor cell are formed in the sidewall of the body contact/source trench 116 using a dopant diffusion process instead of an ion implantation process. The dopant diffusion process includes diffusing dopants of both conductivity types from oppositely-doped dopant source layers which are in contact with different regions of the sidewall of the body contact/source trench 116. By using dopant diffusion instead of implantation to form the source and body contact regions 112, 114, higher aspect ratio trenches may be used (e.g. 2-1, 5-1, 10-1 or higher) and deeper sidewall doping may be realized in the body contact/source trench 116. Embodiments of the dopant diffusion process are described in more detail later herein.

The device may also include a field electrode 118 disposed in a field plate trench 120, for shaping the electric field near the drain region 110.

The source region 112, drain region 110 and drift zone 108 of the device are of a first conductivity type, and the channel region 104, body region 106 and body contact region 114 of the device are of a second conductivity type opposite the first conductivity type. For example, in the case of an n-channel transistor device, the source region 112, drain region 110 and drift zone 108 are n-type and the channel region 104, body region 106 and body contact region 114 are p-type. In the case of a p-channel transistor device, the source region 112, drain region 110 and drift zone 108 are p-type and the channel region 104, body region 106 and body contact region 114 are n-type.

For either type of device, the source region 112, drain region 110, drift zone 108, channel region 104, body region 106 and body contact region 114 may be formed in one or more epitaxial semiconductor layers 122 formed on a base semiconductor substrate 124. The one or more epitaxial semiconductor layers 122 and the base semiconductor substrate 124 may comprise Si or a compound semiconductor such as SiC, GaN, SiGe, AlGaAs, etc.

The semiconductor device shown in FIG. 1 has a lateral trench transistor cell construction in that current flow between the source region 112 and the drain region 110 is primarily lateral (direction Y). The semiconductor device may also have a vertical drain or source connection to the backside of the die (chip). The other connection is at the top side of the die.

Figure 2A:
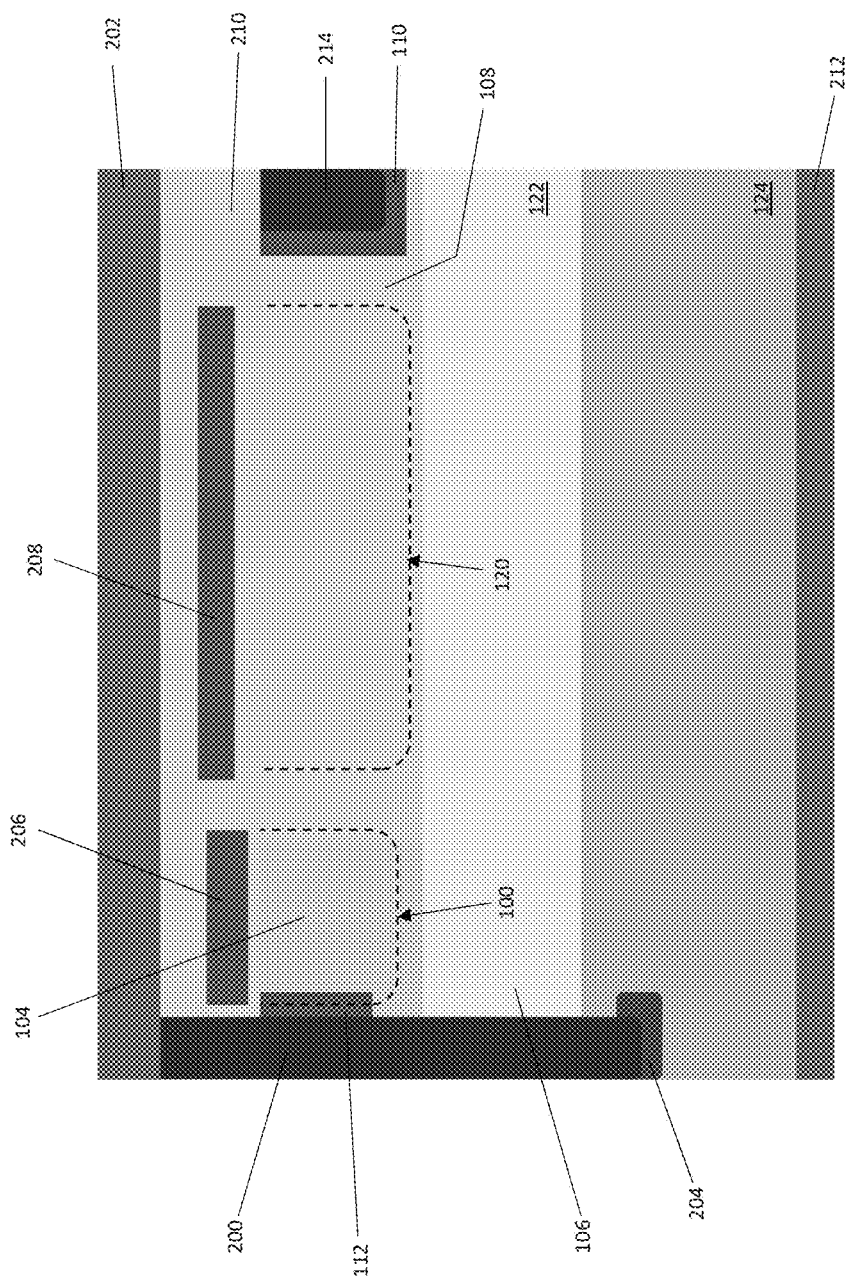
FIGS. 2A and 2B illustrate respective partial cross-sectional views of the device shown in FIG. 1, with a vertical source connection to the backside of the die.
Figure 2B:
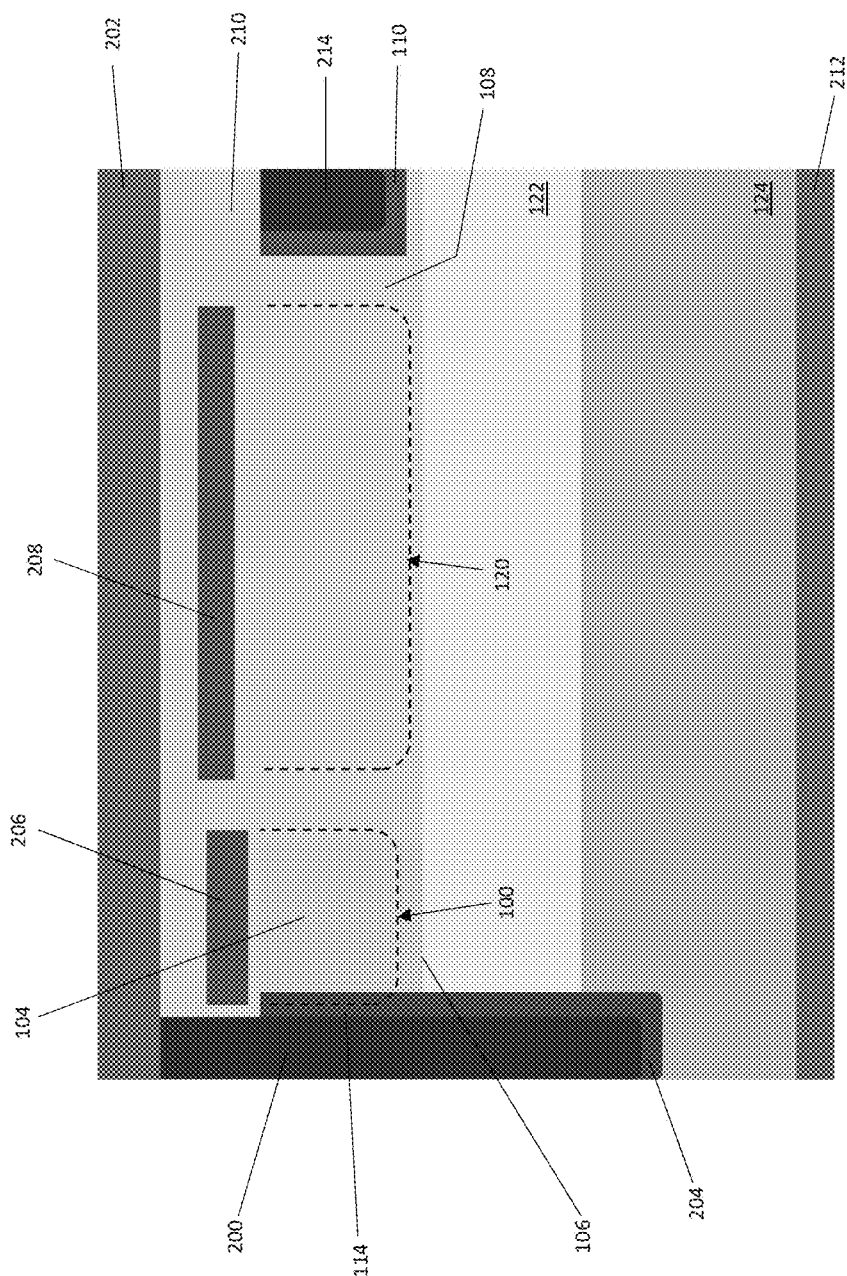

FIGS. 2A and 2B illustrate respective partial cross-sectional views of the exemplary device shown in FIG. 1, with a vertical source connection to the backside of the die. FIG. 2A is taken along a plane of the device which includes the source region 112, whereas FIG. 2B is taken along a plane of the device which includes the body contact region 114. The vertical source connection to the backside of the die includes an electrically conductive contact 200 such as a metal or polysilicon contact which extends from a source metallization 202 at the top side of the die, through the source and body contact regions 112, 114, and into the substrate 124. A highly doped region 204 such as a p+ region may be formed in the substrate 124 to provide a low ohmic connection between the electrically conductive contact 200 and the substrate 124. A gate metal 206 and a field plate metal 208 may be formed in an interlayer dielectric 210, for providing respective electrical connections to the gate electrode 102 and the field plate electrode 118 which are out of view in FIG. 2A. A bottom metallization 212 may be formed on the backside of the substrate 124. An electrically conductive contact 214 such as a metal or polysilicon contact to the drain region 110 terminates in the drain region 112 according to this embodiment.

Figure 3A:
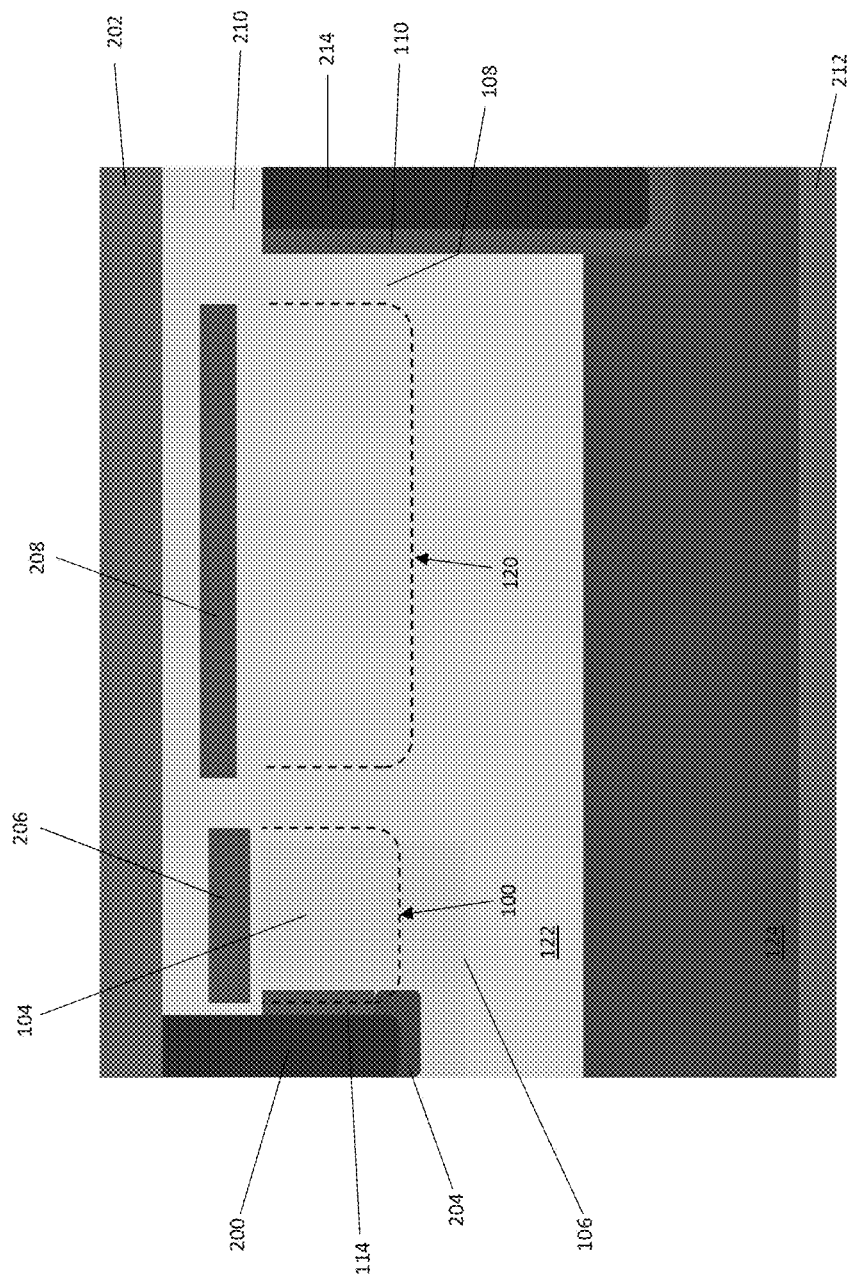
FIGS. 3A and 3B illustrate respective partial cross-sectional views of the device shown in FIG. 1, with a vertical drain connection to the backside of the die.
Figure 3B:
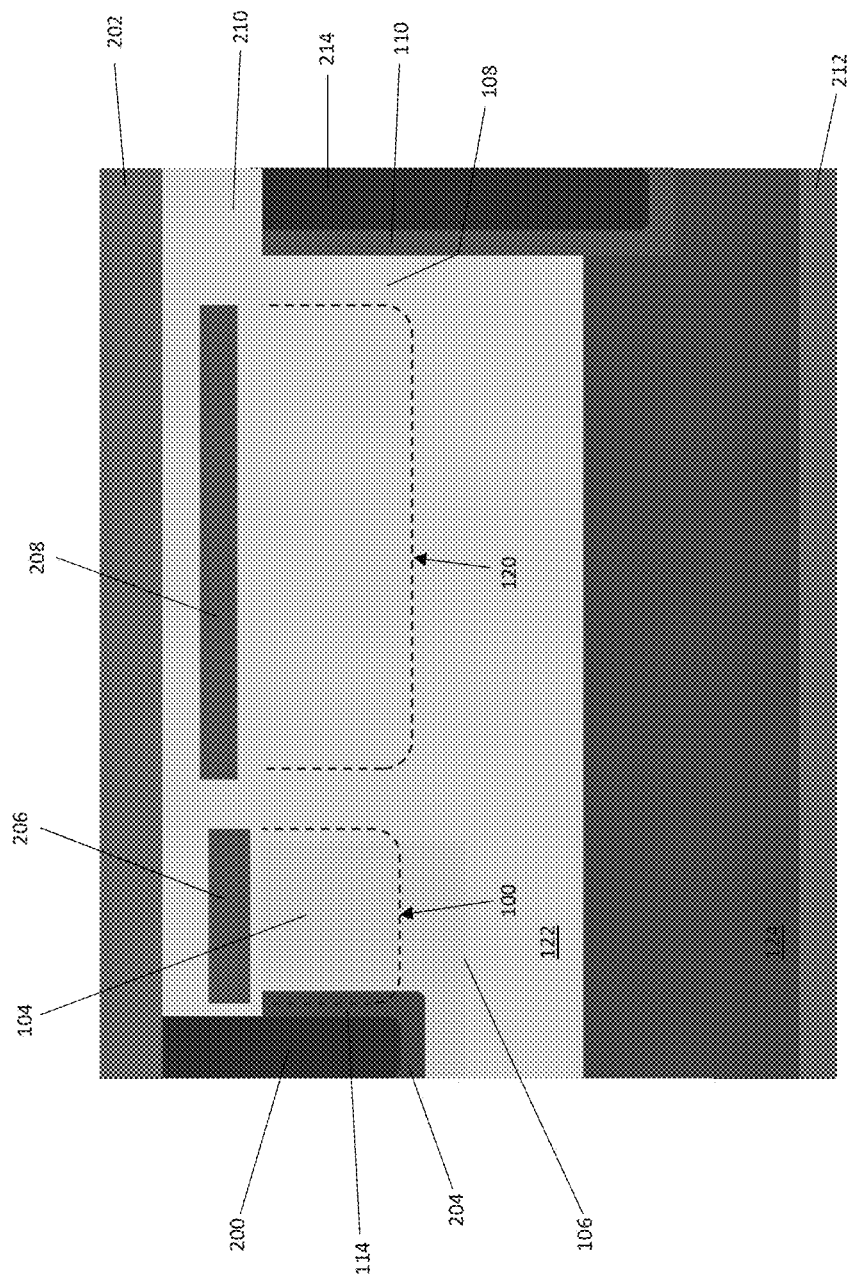

FIGS. 3A and 3B illustrate respective partial cross-sectional views of the exemplary device shown in FIG. 1, with a vertical drain connection to the backside of the die. FIG. 3A is taken along a plane of the device which includes the source region 112, whereas FIG. 3B is taken along a plane of the device which includes the body contact region 114. The embodiment shown in FIGS. 3A-3B is similar to the embodiment shown in FIGS. 2A-2B. Different, however, the source contact 200 terminates in the body region 106 and the drain contact 214 extends into the substrate 124. In FIGS. 2A-2B, the substrate 124 and epitaxial layer 122 grown on the substrate are p-type, whereas the substrate 124 and epitaxial layer 122 are n-type in FIGS. 3A-3B. In each case, the source and body contact regions 112, 114 of the lateral trench transistor cell are formed in the sidewall of the body contact/source trench 116 using a dopant diffusion process as described in more detail below.

FIGS. 4A through 11C illustrate respective views of an embodiment of manufacturing a semiconductor device having source and body contact regions formed in a sidewall of a body contact/source trench using a dopant diffusion process instead of ion implantation. FIGS. 4A-11A show the same first cross-sectional view, FIGS. 4B-11B show the same top-down plan view and FIGS. 4C-11C show the same second cross-sectional view during different stages of the manufacturing process. The cross-sectional view shown in FIGS. 4A-11A is taken along the line labelled A-A' in FIGS. 4B-11B, and the cross-sectional view shown in FIGS. 4C-11C is taken along the line labelled B-B' in FIGS. 4B-11B. Elements which are illustrated but out of view in FIGS. 4A through 12C are shown as dashed lines.

Figure 4C:
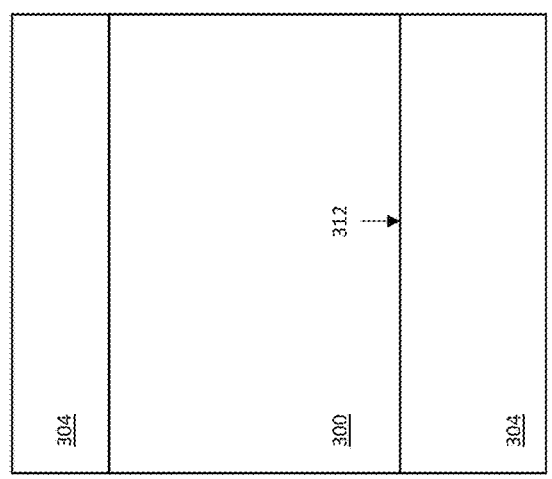
FIGS. 4A to 4C, 5A to 5C, 6A to 6C, 7A to 7C, 8A to 8C, 9A to 9C, 10A to 10C, and 11A to 11C illustrate respective views of an embodiment of manufacturing a semiconductor device having source and body contact regions formed in a sidewall of a body contact/source trench using a dopant diffusion process instead of ion implantation.
Figure 4B:
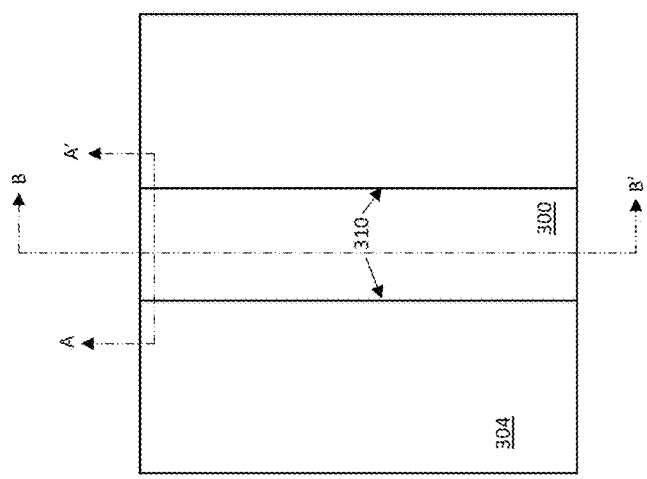
Figure 4A:
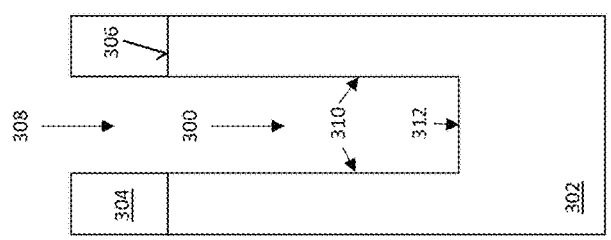

FIGS. 4A through 4C show the device after a trench 300 is formed in a semiconductor layer 302. The semiconductor layer 302 may include one or more epitaxial layers grown on a base semiconductor substrate. The trench 300 may be formed in the semiconductor layer 302 by forming a hard mask 304 such as an oxide on the top surface 306 of the semiconductor layer 302, patterning an opening 308 in the hard mask, e.g., by lithography to define a region for the trench 300, and etching the part of the semiconductor layer 302 exposed by the opening 308 in the hard mask 304. The resulting trench 300 may have a high aspect ratio, e.g., 2-1, 5-1, 10-1 or even higher. The trench 300 has a sidewall 310 and a bottom 312.

Figure 5C:
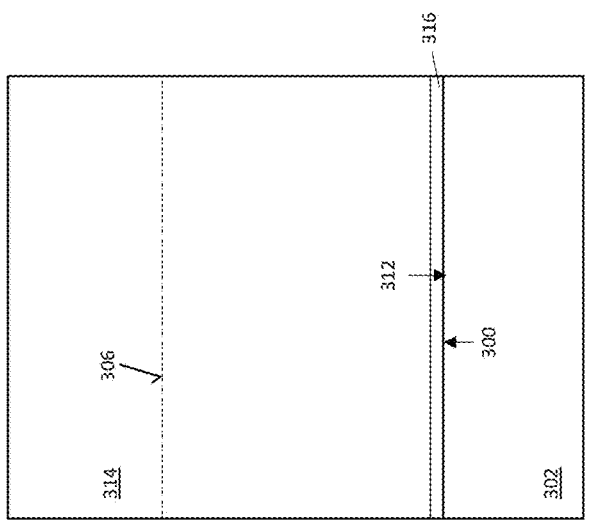
Figure 5B:
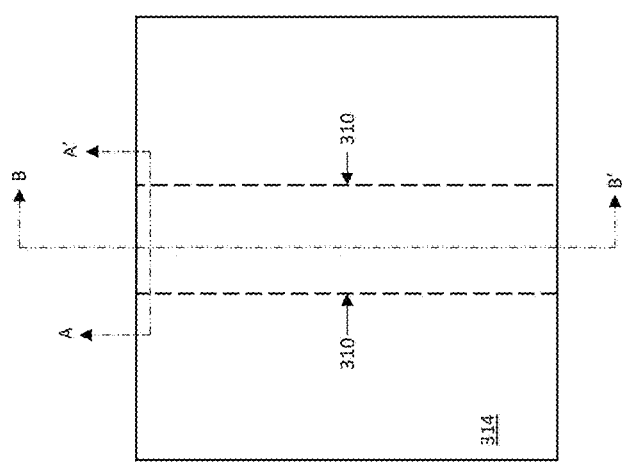
Figure 5A:
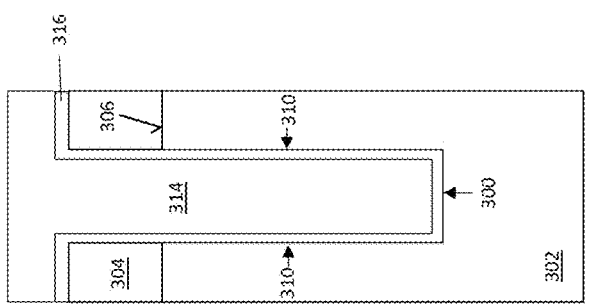

FIGS. 5A through 5C show the device after a photoresist bilayer stack 314 is formed in the trench 300. Before the photoresist bilayer stack 314 is formed, a first dopant source layer 316 is formed along the sidewall 310 and the bottom 312 of the trench 300. The first dopant source layer 316 contains a dopant species of the second conductivity type. For example, if the second conductivity type is p-type, the first dopant source layer 316 may be boron-doped silicate glass (BSG). If the second conductivity type is instead n-type, the first dopant source layer 316 may be phosphorous-doped silicate glass (PSG). The photoresist bilayer stack 314 is then deposited on the structure, e.g. as a silicate coating, filling the trench 300.

As described above, the source and body contact regions of the device may be formed as alternating vertical stripes (source region, body (bulk) contact region, source region, body (bulk) contact region, . . . ) in the trench sidewall 310 along the length of the trench 300, e.g. extension of the trench parallel to the surface. Lithography and dry etching may be used to form the alternating arrangement of source region and body (bulk) contact regions. The photoresist bilayer stack 314 is compatible with dry etching. In a bilayer resist system, two types of resists are spun onto one another. The lower resist does not contain a photoactive agent. The upper resist contains a photoactive agent and an agent that absorbs, e.g., Si. The upper resist may be illuminated and developed. A mechanical or other treatment causes the upper layer to absorb, e.g., Si, to generate an etch selectivity between the two resists. The upper resist can then be used as a hard mask for structuring the lower resist. Lithography may be performed at the top surface 306 to transfer a structure into the deep trench 300 using dry etching.

Figure 6C:
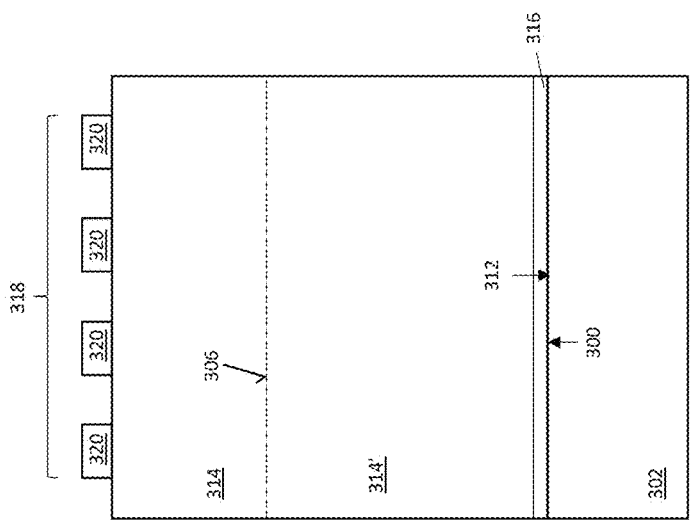
Figure 6B:
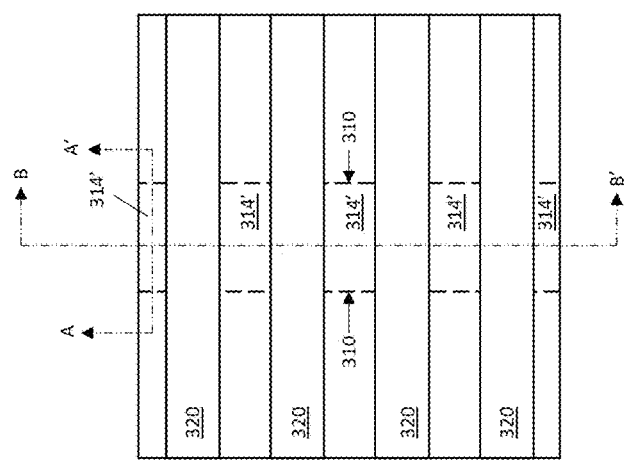
Figure 6A:
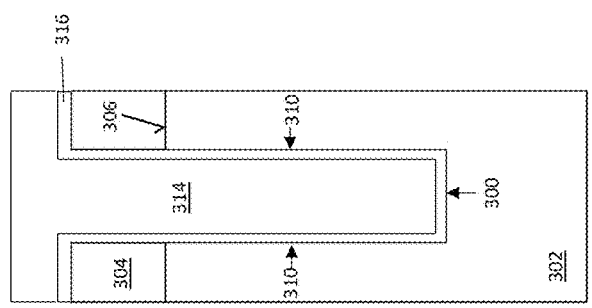

FIGS. 6A through 6C show the device after a lithography mask 318 is formed over the top surface 306 of the semiconductor layer 302. The lithography mask 318 is formed within the photoresist bilayer stack 314 and is patterned into stripes 320 which extend along the first surface 306 of the semiconductor layer 302 in a direction transverse to the length of the trench 300. This way, regions 314' of the photoresist bilayer stack 314 in the trench 300 are uncovered by the patterned lithography mask 318.

Figure 7C:
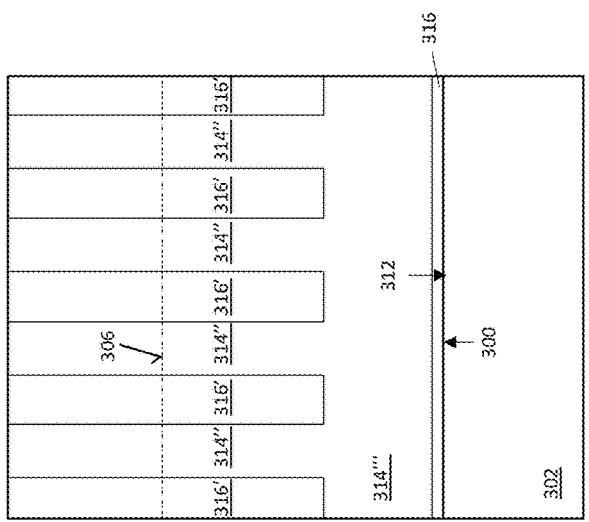
Figure 7B:
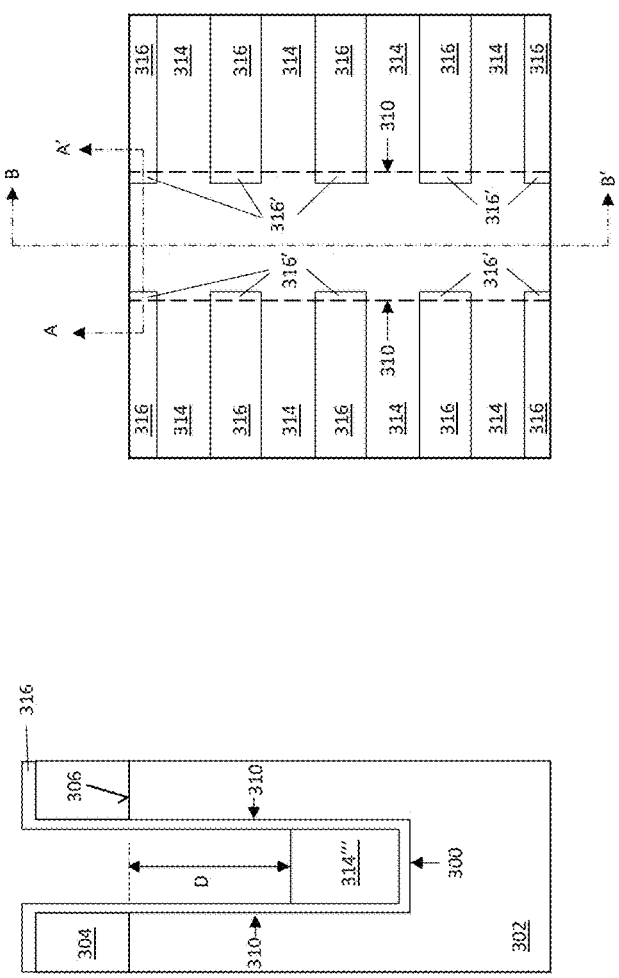
Figure 7A:
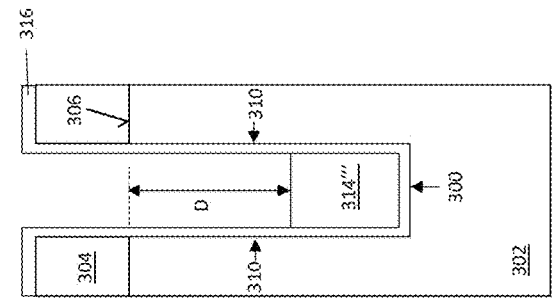

FIGS. 7A through 7C show the device after recessing the regions 314' of the photoresist bilayer stack 314 in the trench 300 uncovered by the patterned lithography mask 318, and after removing the patterned lithography mask 318. The recessed part 314''' of the photoresist bilayer stack terminates at a depth D in the trench 300. The regions 314'' of the photoresist bilayer stack 314 in the trench 300 covered by the stripes 320 of the patterned lithography mask 318 are not recessed during the structuring (recessing) process. By structuring the photoresist bilayer stack 314 selective to the first dopant source layer 316, vertical stripes 316' of the first dopant source layer 316 are exposed in an upper part of the trench 300. The exposed vertical stripes 316' of the first dopant source layer 316 are spaced apart from one another along the length of the trench 300 by the parts 314'' of the structured photoresist bilayer stack 314 covered by the stripes 320 of the patterned lithography mask 318 during the structuring process.

Figure 8C:
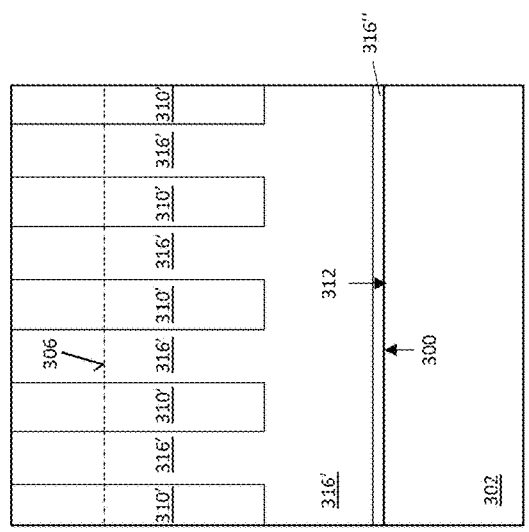
Figure 8B:
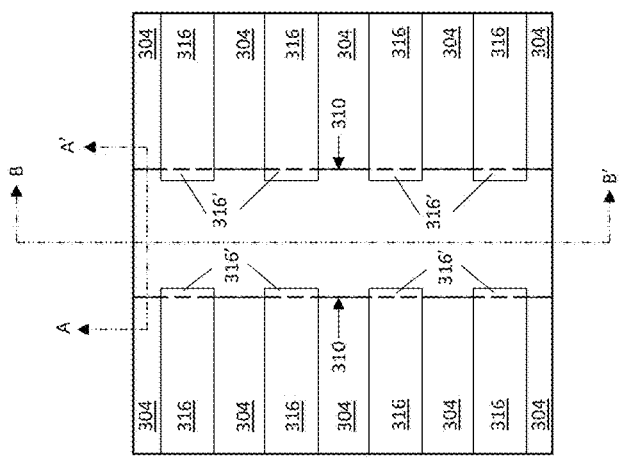
Figure 8A:
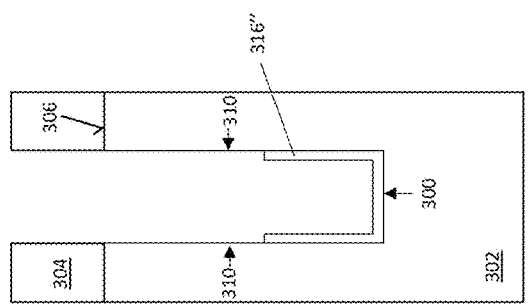

FIGS. 8A through 8C show the device after removing the exposed vertical stripes 316' of the first dopant source layer 316 from the upper part of the trench 300 to expose vertical stripes 310' of the trench sidewall 300, and after the remainder of the structured photoresist bilayer stack 314 is removed. In one embodiment, the structured photoresist bilayer stack 314 comprises silicon comprising resist and the exposed vertical stripes 316' of the first dopant source layer 316 are removed from the upper part of the trench 300 using an etchant which is selective to the silicon comprising resist. For example, in the case of BSG as the first dopant source layer 316, the exposed vertical stripes 316' of the first dopant source layer 316 are removed from the upper part of the trench 300 using HF/H$_2$SO$_4$.

Figure 9C:
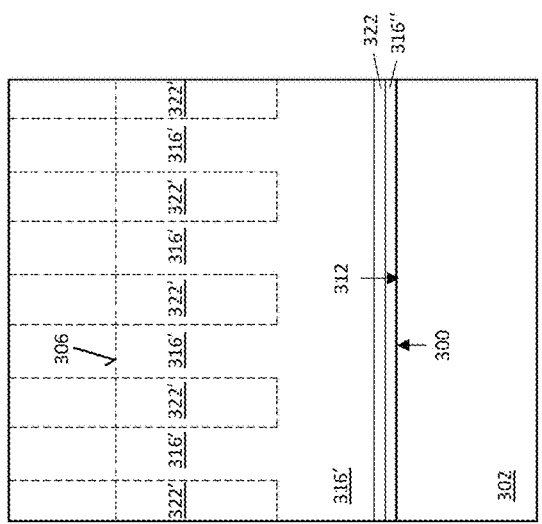
Figure 9B:
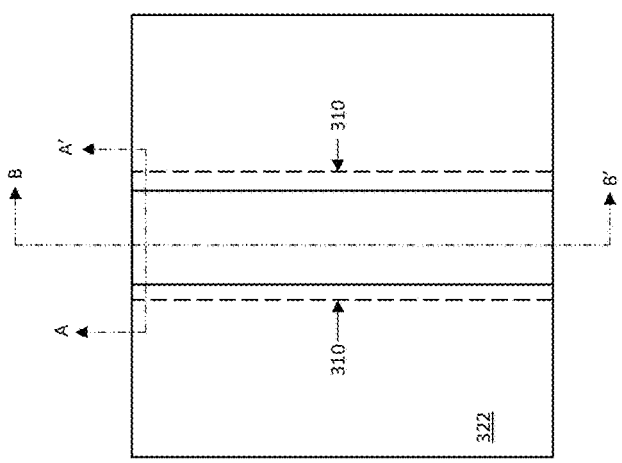
Figure 9A:
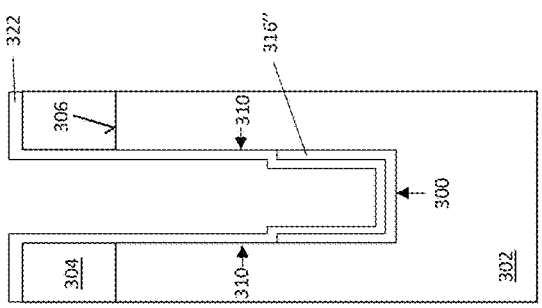

FIGS. 9A through 9C show the device after forming a second dopant source layer 322 in contact with the exposed vertical stripes 310' of the trench sidewall 310. The second dopant source layer 322 contains a dopant species of the first conductivity type. For example, if the first conductivity type is n-type, the second dopant source layer 322 may be PSG. If the first conductivity type is instead p-type, the second dopant source layer 322 may be BSG. The second dopant source layer 322 has the form of stripes 322' where in contact with the previously exposed vertical stripes 310' of the trench sidewall 310. The vertical stripes 322' of the second dopant source layer 322 correspond to source region locations and the vertical stripes 316' of the first dopant source layer 316 correspond to body contact region locations in the trench sidewall 310. The stripes 316', 322' of the different dopant source layers 316, 322 alternate along the length of the trench 300. The first dopant source layer 316 remains on the entire trench sidewall 310 in the lower part of the trench 300 and on the trench bottom 312.

Figure 10C:
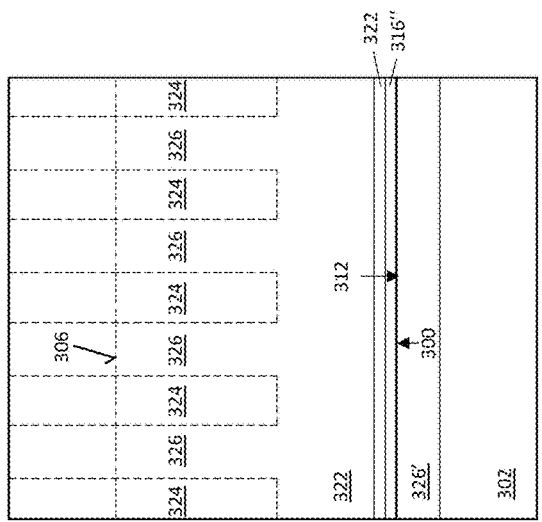
Figure 10B:
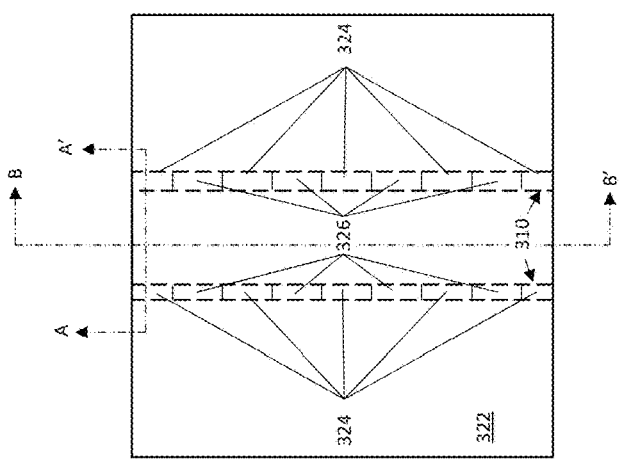
Figure 10A:
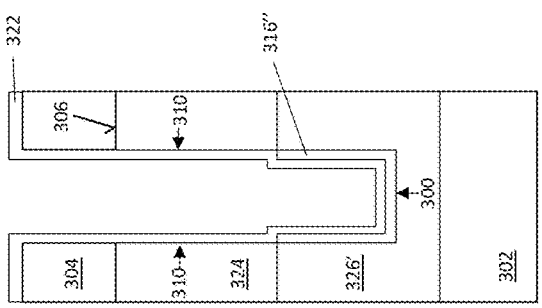

FIGS. 10A through 10C show the device after diffusing the dopant species of the second conductivity type from the first dopant source layer 316 into first regions of the trench sidewall 310 in contact with the first dopant source layer 316, and diffusing the dopant species of the first conductivity type from the second dopant source layer 322 into second regions of the trench sidewall 310 in contact with the second dopant source layer 322. The diffusing may be implemented by annealing at elevated temperature. Vertical stripes of source regions 324 are formed from the diffused dopant species of the first conductivity type, and vertical stripes of body contact regions 326 are formed from the diffused dopant species of the second conductivity type. The source region stripes 324 and body contact region stripes 326 alternate along the length of the trench. A continuous body contact region 326' may be formed in the trench sidewall 310 in a lower part of the trench 300 and in the trench bottom 312. The continuous body contact region 326' is used in case of a breakthrough between body and drain for low voltage current flow. For example, if there was no continuous p+ body region, the n+ region at the bottom of the trench 300 would result in a voltage drop in the body region for high avalanche currents.

Figure 11C:
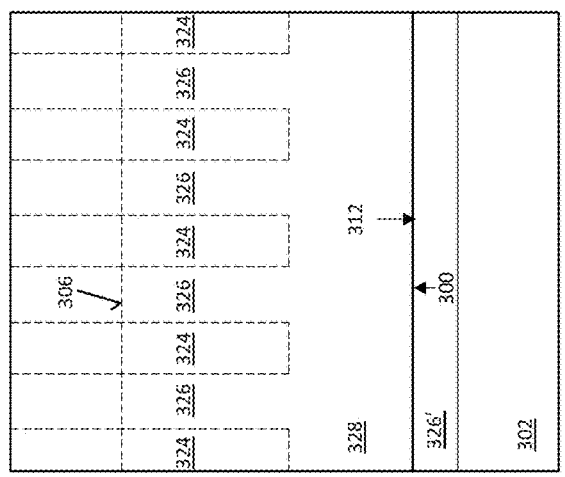
Figure 11B:
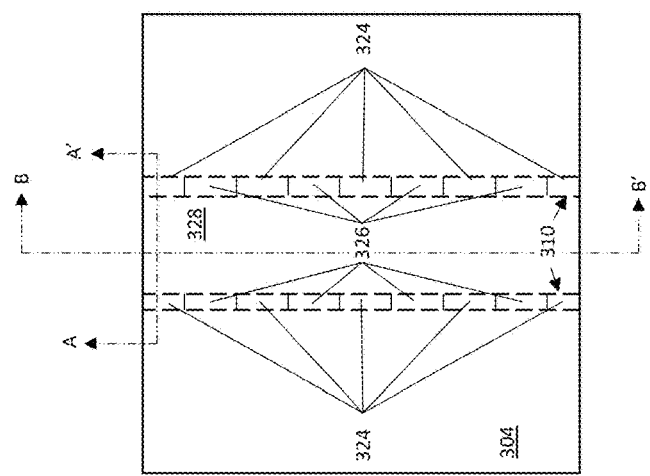
Figure 11A:
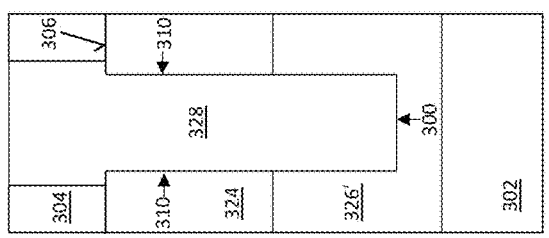

FIGS. 11A through 11C show the device after removing the first dopant source layer 316 and the second dopant source layer 322 from the trench 300, and after filling the trench 300 with an electrically conductive material 328 such as a metal or polysilicon which is in direct contact with the source regions 324 and the body contact regions 326, 326' along the length of the trench 300. The electrically conductive material 328 provides a source connection which may terminate in the semiconductor layer 302 as shown in FIGS. 11A through 11C, or may extend into the underlying semiconductor substrate (not shown) to provide a vertical source connection to the backside of the die, e.g., as shown in FIGS. 2A-2B.

FIGS. 12A through 18C illustrate respective views of another embodiment of manufacturing a semiconductor device having source and body contact regions formed in a sidewall of a body contact/source trench using a dopant diffusion process instead of ion implantation. FIGS. 12A-18A show the same first cross-sectional view, FIGS. 12B-18B show the same top-down plan view and FIGS. 12C-18C show the same second cross-sectional view during different stages of the manufacturing process. The cross-sectional view shown in FIGS. 12A-18A is taken along the line labelled C-C' in FIGS. 12B-18B, and the cross-sectional view shown in FIGS. 12C-18C is taken along the line labelled D-D' in FIGS. 12B-18B. Elements which are illustrated but out of view in FIGS. 12A through 18C are shown as dashed lines.

Figure 12C:
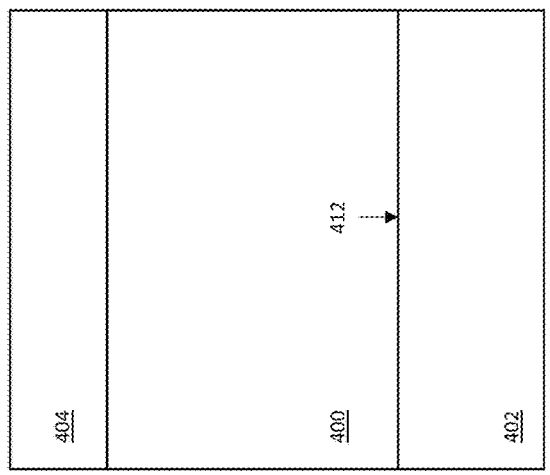
FIGS. 12A to 12C, 13A to 13C, 14A to 14C, 15A to 15C, 16A to 16C, 17A to 17C, and 18A to 18C illustrate respective views of another embodiment of manufacturing a semiconductor device having source and body contact regions formed in a sidewall of a body contact/source trench using a dopant diffusion process instead of ion implantation.
Figure 12B:
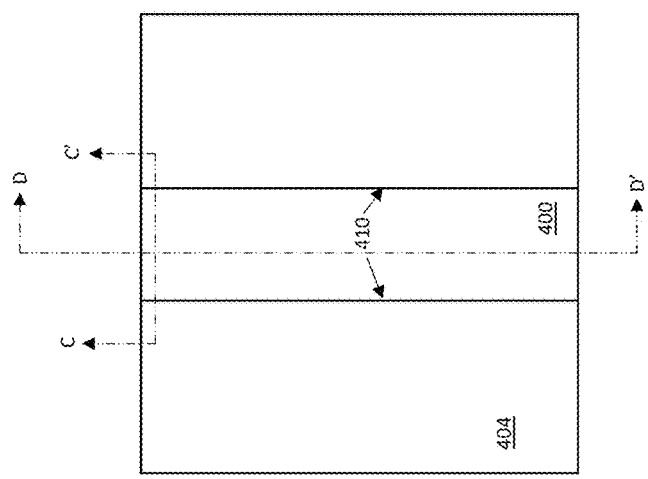
Figure 12A:
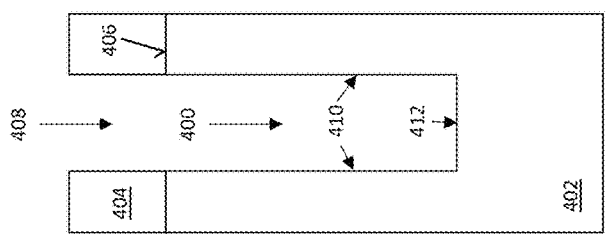

FIGS. 12A through 12C show the device after a trench 400 is formed in a semiconductor layer 402. The semiconductor layer 402 may include one or more epitaxial layers grown on a base semiconductor substrate. The trench 400 may be formed in the semiconductor layer 402 by forming a hard mask 404 such as an oxide on the top surface 406 of the semiconductor layer 402, patterning an opening 408 in the hard mask, e.g., by lithography to define a region for the trench 300, and etching the part of the semiconductor layer 302 exposed by the opening 408 in the hard mask 404. The resulting trench 400 may have a high aspect ratio, e.g., 2-1, 5-1, 10-1 or even higher. The trench 400 has a sidewall 410 and a bottom 412.

Figure 13C:
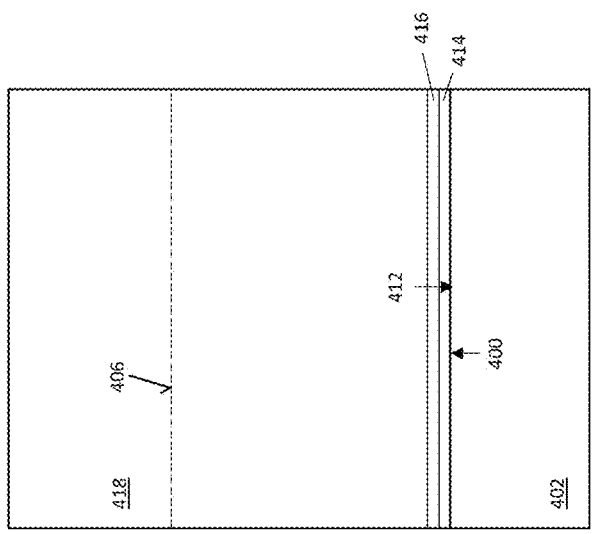
Figure 13B:
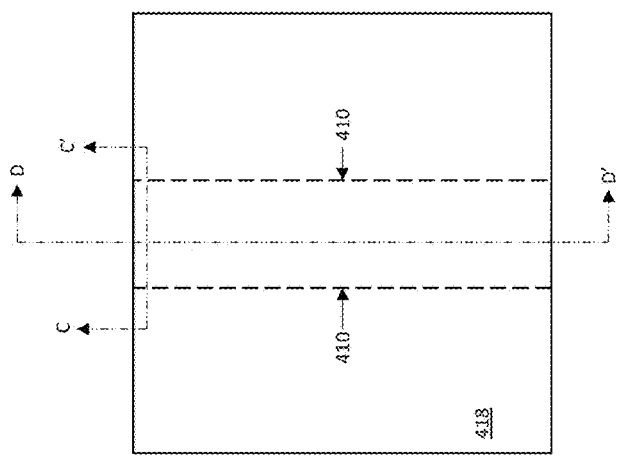
Figure 13A:
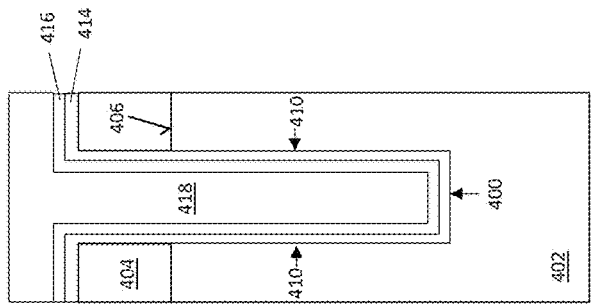

FIGS. 13A through 13C show the device after forming a first dopant source layer 414 along the sidewall 410 and the bottom 412 of the trench 400, forming an etch mask layer 416 on the first dopant source layer 414, and after forming the first dopant source layer 414 and the etch mask layer 416, filling the trench with a filling material 418. The first dopant source layer 414 contains a dopant species of the second conductivity type. For example, if the second conductivity type is p-type, the first dopant source layer 414 may be BSG. If the second conductivity type is instead n-type, the first dopant source layer 414 may be PSG. The etch mask layer 416 has a different etch selectivity than the first dopant source layer 414. In one embodiment, the filling material 418 is polysilicon or metal and the etch mask layer 416 is silicon nitride (SiN).

Figure 14C:
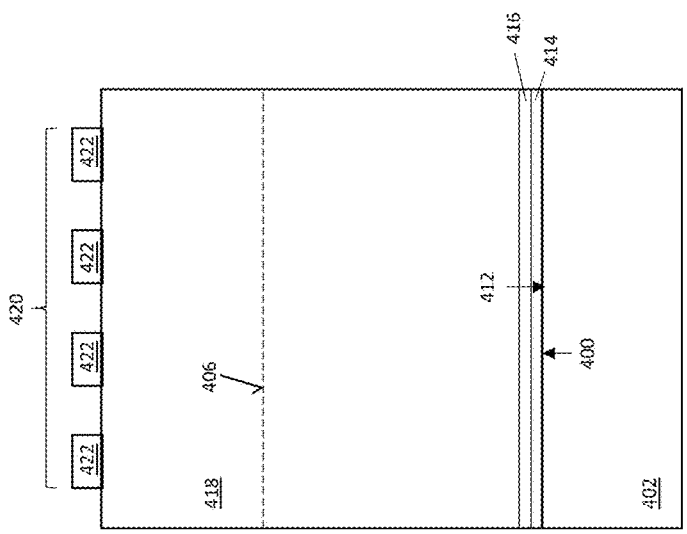
Figure 14B:
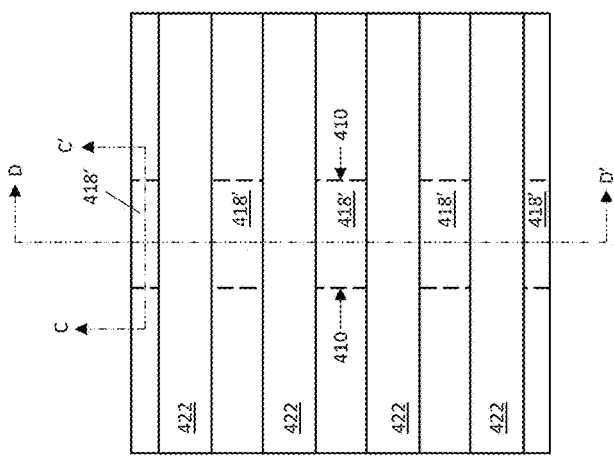
Figure 14A:
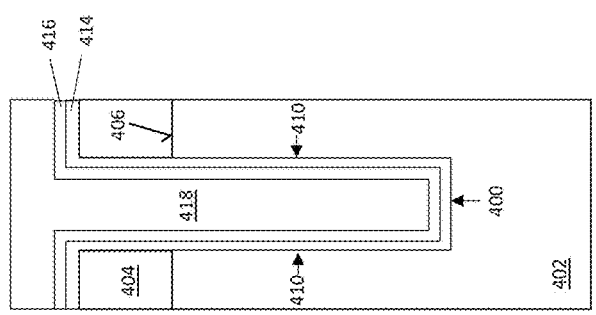

FIGS. 14A through 14C show the device after a lithography mask 420 is formed over the top surface 406 of the semiconductor layer 402. The lithography mask 420 covers the filling material 418, etch mask layer 416 and first dopant source layer 414. The lithography mask 420 is patterned into stripes 422 which extend along the first surface 406 of the semiconductor layer 402 and over the filling material 418, etch mask layer 416 and first dopant source layer 414 in a direction transverse to the length of the trench 400. This way, regions 418' of the filling material 418 in the trench 400 are uncovered by the patterned lithography mask 420.

Figure 15C:
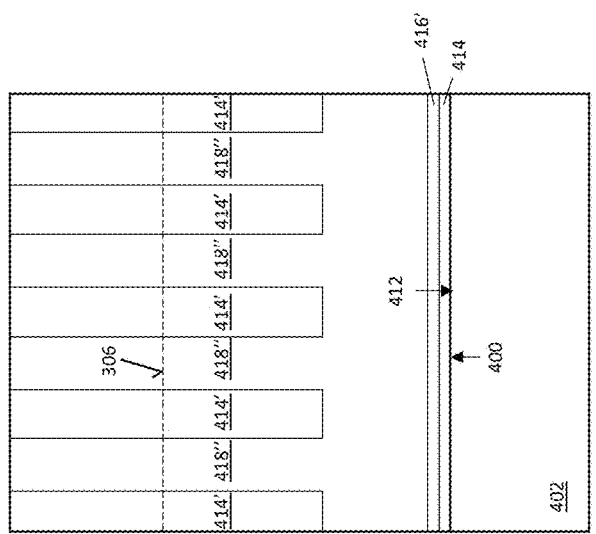
Figure 15B:
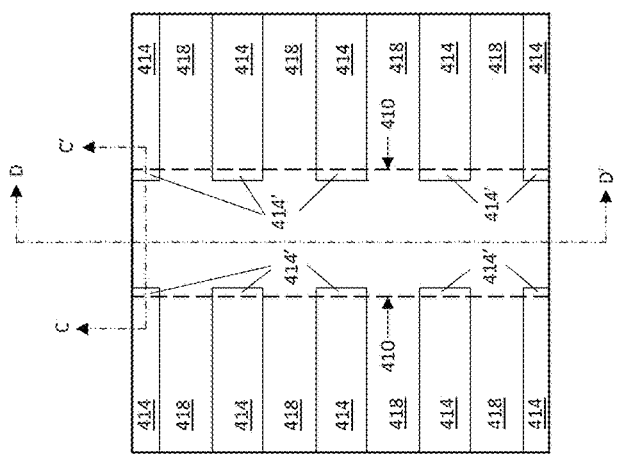
Figure 15A:
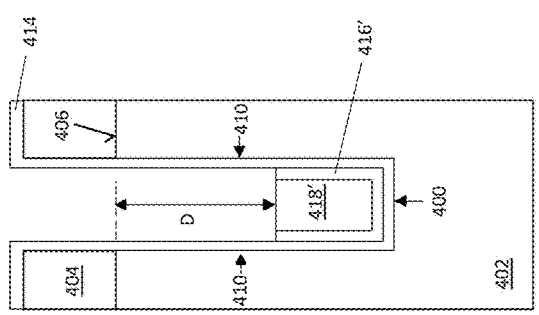

FIGS. 15A through 15C show the device after structuring (recessing) the filling material 418 and the etch mask layer 416 selective to the first dopant source layer 414, and after removing the patterned lithography mask 420. The recessed part 418' of the filling material 418 and the recessed part 416' of the etch mask layer 416 terminate at a depth D in the trench 400. Regions 418'' of the filling material 418 in the trench 400 covered by the stripes 422 of the patterned lithography mask 420 are not recessed during the structuring (recessing) process. By structuring the filling material 418 and the etch mask layer 416 selective to the first dopant source layer 414, vertical stripes 414' of the first dopant source layer 414 are exposed in an upper part of the trench 400. The exposed vertical stripes 414' of the first dopant source layer 414 are spaced apart from one another along the length of the trench 400 by the parts 418'' of the filling material 418 covered by the stripes 422 of the patterned lithography mask 420 during the structuring process. The remainder 418' of the filling material 418 is then removed to expose the recessed part 416' of the etch mask layer 416 in the lower portion of the trench 400.

Figure 16C:
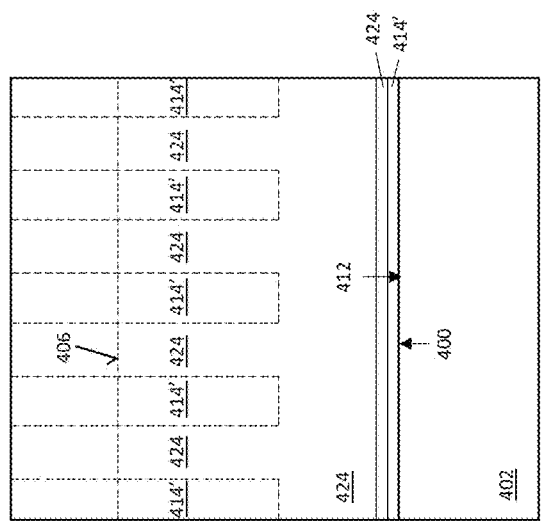
Figure 16B:
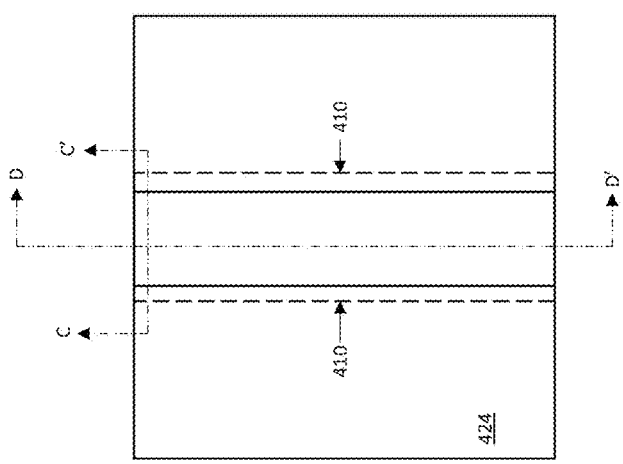
Figure 16A:
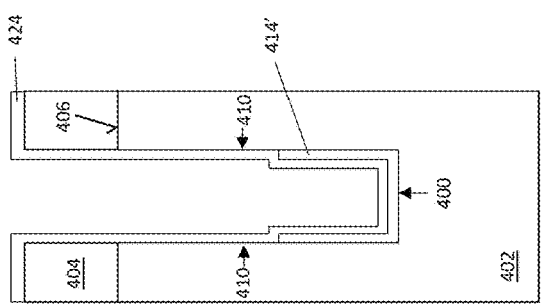

FIGS. 16A through 16C show the device after the remainder 418' of the filling material 418 is removed from the trench 400, and after removing the exposed vertical stripes 414' of the first dopant source layer 414 from the upper part of the trench 400 to expose vertical stripes of the trench sidewall 400, after optionally removing the remainder 416' of the etch mask layer 416 from the trench 400, and after forming a second dopant source layer 424 in contact with the exposed vertical stripes of the trench sidewall 410. For example, if the first conductivity type is n-type, the second dopant source layer 424 may be PSG. If the first conductivity type is instead p-type, the second dopant source layer 424 may be BSG. The second dopant source layer 424 has the form of stripes 424' where in contact with the previously exposed vertical stripes of the trench sidewall 410. The vertical stripes 424' of the second dopant source layer 424 correspond to source region locations and the vertical stripes 414' of the first dopant source layer 414 correspond to body contact region locations in the trench sidewall 410. The stripes 414', 424' of the different dopant source layers 414, 424 alternate along the length of the trench 400. Part 414' of the first dopant source layer 414 remains on the entire trench sidewall 410 in the lower part of the trench 400 and on the trench bottom 412.

Figure 17C:
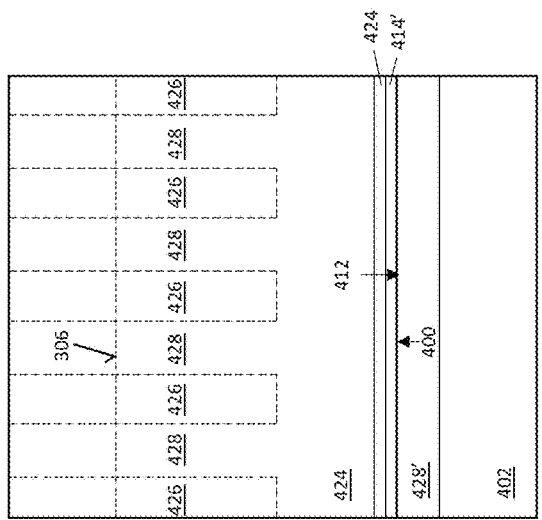
Figure 17B:
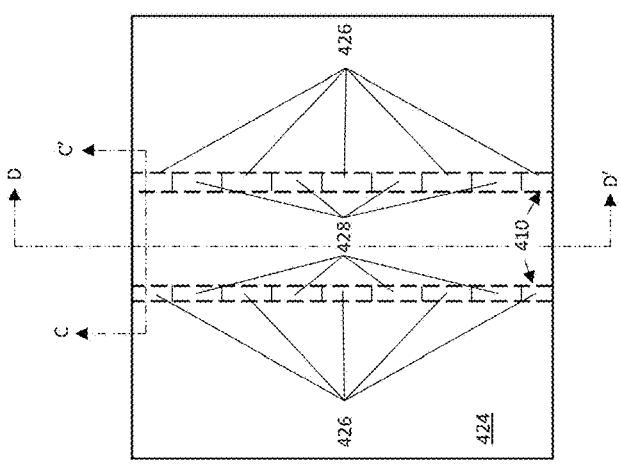
Figure 17A:
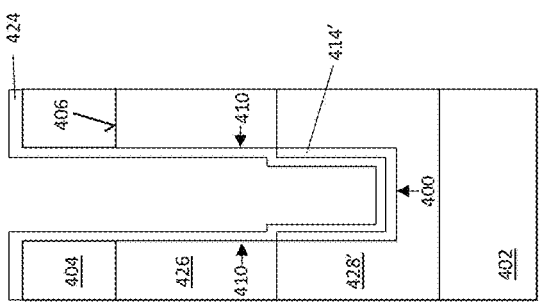

FIGS. 17A through 17C show the device after diffusing the dopant species of the second conductivity type from the first dopant source layer 414 into first regions of the trench sidewall 410 in contact with the first dopant source layer 414, and diffusing the dopant species of the first conductivity type from the second dopant source layer 424 into second regions of the trench sidewall 410 in contact with the second dopant source layer 424. The diffusing may be implemented by annealing at elevated temperature. Vertical stripes of source regions 426 are formed from the diffused dopant species of the first conductivity type, and vertical stripes of body contact regions 428 are formed from the diffused dopant species of the second conductivity type. The source region stripes 426 and body contact region stripes 428 alternate along the length of the trench. A continuous body contact region 428' may be formed in the trench sidewall 410 in a lower part of the trench 400 and in the trench bottom 412.

Figure 18C:
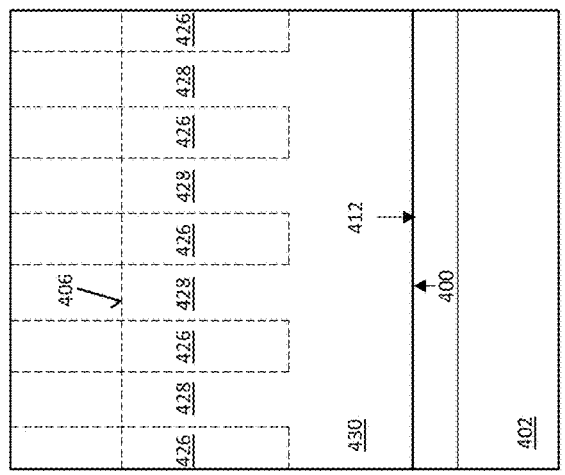
Figure 18B:
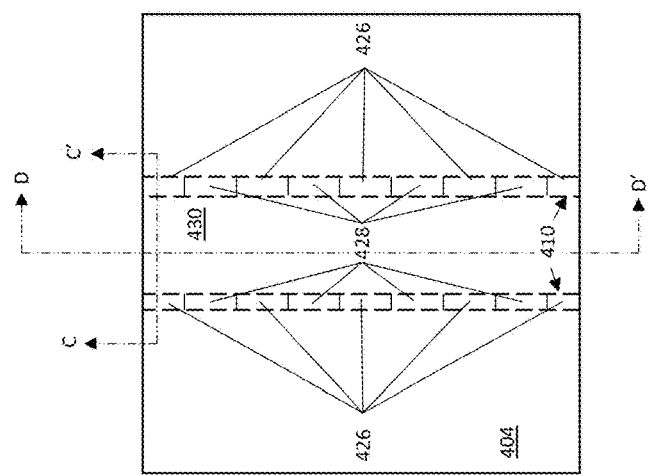
Figure 18A:
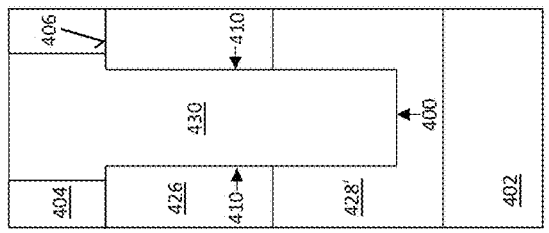

FIGS. 18A through 18C show the device after removing the remaining first dopant source layer 414' and the second dopant source layer 424 from the trench 400, and after filling the trench 400 with an electrically conductive material 430 such as metal or polysilicon which is in direct contact with the source regions 426 and the body contact regions 428, 428' along the length of the trench 400. The electrically conductive material 430 provides a source connection which may terminate in the semiconductor layer 402 as shown in FIGS. 18A through 18C, or may extend into the underlying semiconductor substrate (not shown) to provide a vertical source connection to the backside of the die, e.g., as shown in FIGS. 2A-2B.

Figure 21:
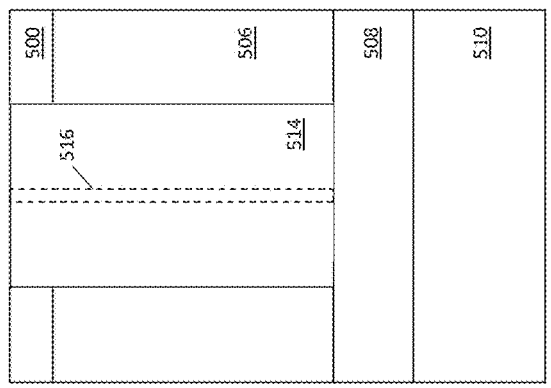
FIGS. 19 through 21 illustrate partial cross-sectional views of an embodiment of a method of forming the body (bulk) region of a semiconductor device.
Figure 20:
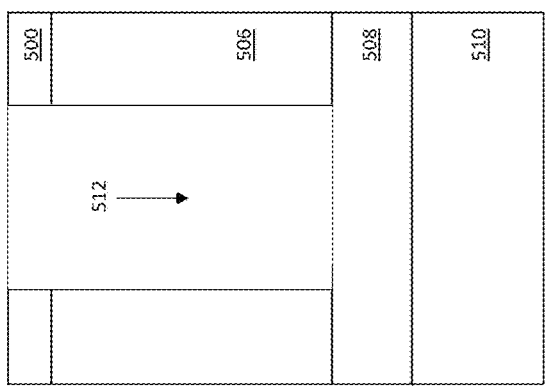
Figure 19:
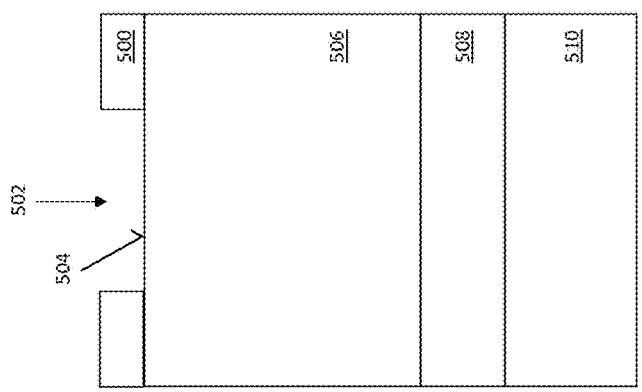

FIGS. 19 through 21 illustrate partial cross-sectional views of an embodiment of a method of forming the body (bulk) region of the semiconductor devices previously described herein.

FIG. 19 shows a hard mask 500 such as an oxide with an opening 502 formed on a first surface 504 of a semiconductor layer 506. The semiconductor layer 506 may be of the kind previously described herein in which a source/body contact trench extends through semiconductor layer 506 to provide a vertical connection path. For example, the semiconductor layer 506 may comprises one or more epitaxial layers of the same and/or different conductivity types. In one embodiment, the semiconductor layer 506 provides the drift zone of a device. The semiconductor layer 506 may be formed on another epitaxial layer 508 such as a lightly doped (e.g. p– for source-down configuration/n– for drain-down configuration) epitaxial layer. A doped substrate 510 such as a p+ or n+ substrate may be disposed under the semiconductor layer 508.

FIG. 20 shows the semiconductor layer 506 after etching the semiconductor layer 506 through the opening 502 in the hard mask 500 to form a trench 512 in the semiconductor layer 506. The semiconductor layer 506 may be etched until reaching the underlying epitaxial layer 508 on which the semiconductor layer 506 is formed. The trench 512 may be a trench formed in the drift zone.

FIG. 21 shows the semiconductor layer 506 after filling the trench 512 with an epitaxial fill material 514 having the second conductivity type. The epitaxial fill material 514 forms the body region of the device. The body region thus may be formed by etching out part of the drift zone and refilling the drift zone with doped epitaxial material, according to this embodiment.

The epitaxial fill material 514 may be planarized by CMP, back etching, or both CMP and back etching. The epitaxial fill material 514 may be grown by selective or standard epitaxy. In case of standard epitaxy, a polysilicon deposition on the hard mask 500 may have to be removed, e.g., with CMP (chemical-mechanical polishing). With Si-epitaxy, high aspect ratios can be filled and channel length is not determined by lateral implant challenges. A slight taper in the Si main etch may be corrected by crystal plane sensitive wet etch processes. In case of crystal faults or doping incorporation anomalies in a seam region 516 in the central part of the epitaxial fill material 514, the seam region 516 may be later etched away to form the source/body contact trench, thus preventing adverse electrical behavior.

Figure 22:
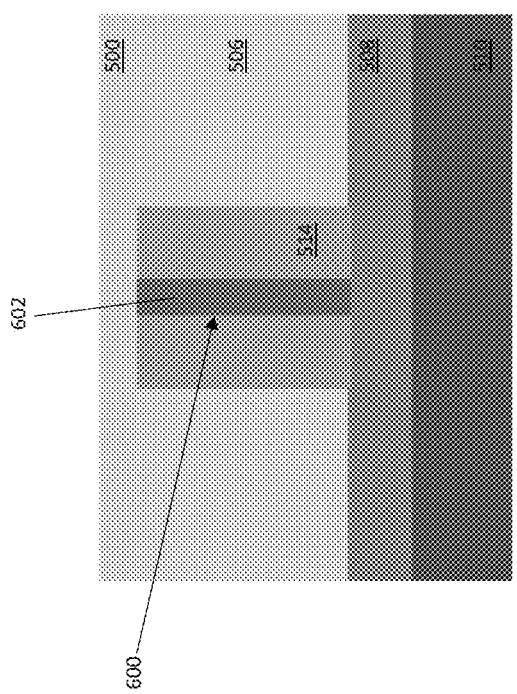
FIG. 22 illustrates a partial cross-sectional view of an embodiment of a semiconductor device having a body region fabricated in accordance with the method of FIGS. 19 through 21, and in which a vertical contact trench is formed through the central part of the body region and filled with an electrically conductive material 506.

FIG. 22 illustrates an embodiment in which a vertical contact trench 600 is formed through the central part of the epitaxial fill material 514 and extends into the doped substrate 510 disposed under the semiconductor layer 506. The vertical contact trench 600 is filled with an electrically conductive material 602 such as polysilicon or metal which electrically connects the source regions or the drain region to the doped substrate 510, e.g., as previously described herein in connection with FIGS. 2A-2B and 3A-3B. Neither source nor drain regions are shown in FIG. 21 for ease of illustration. In the case of the source regions, the source regions may be formed in accordance with the dopant diffusion embodiments described herein.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    epitaxially growing a semiconductor layer, the semiconductor layer including a drift zone of a first conductivity;
    forming a trench in a first side of the semiconductor layer;
    forming a drain region of the first conductivity type in the first side of the semiconductor layer and laterally adjoining the drift zone;
    forming a body region of a second conductivity type opposite the first conductivity type and laterally adjoining the drift zone at a side of the drift zone opposite the drain region; and
    forming source regions of the first conductivity type and body contact regions of the second conductivity type in a sidewall of the trench and arranged in an alternating manner along a length of the trench, using a dopant diffusion process which includes diffusing dopants of both conductivity types from oppositely-doped dopant source layers which are in contact with different regions of the sidewall.

2. The method of claim 1, wherein diffusing dopants of both conductivity types from oppositely-doped dopant source layers comprises:
    forming a first dopant source layer along the sidewall and a bottom of the trench, the first dopant source layer containing a dopant species of the second conductivity type;
    after forming the first dopant source layer, filling the trench with a photoresist bilayer stack;
    structuring the photoresist bilayer stack selective to the first dopant source layer to expose vertical stripes of the first dopant source layer in an upper part of the trench and which are spaced apart from one another by the structured photoresist bilayer stack along the length of the trench;
    removing the exposed vertical stripes of the first dopant source layer from the upper part of the trench to expose vertical stripes of the trench sidewall;

after removing the exposed vertical stripes of the first dopant source layer, removing the structured photoresist bilayer stack from the trench;

forming a second dopant source layer in contact with the exposed vertical stripes of the trench sidewall, the second dopant source layer containing a dopant species of the first conductivity type; and diffusing the dopant species of the second conductivity type from the first dopant source layer into first regions of the trench sidewall in contact with the first dopant source layer, and diffusing the dopant species of the first conductivity type from the second dopant source layer into second regions of the trench sidewall in contact with the second dopant source layer.

3. The method of claim 2, wherein the first conductivity type is n-type, wherein the second conductivity type is p-type, wherein the first dopant source layer comprises a boron-doped silicate glass, and wherein the second dopant source layer comprises a phosphorous-doped silicate glass.

4. The method of claim 3, wherein the structured photoresist bilayer stack comprises silicon comprising resist, and wherein the exposed vertical stripes of the first dopant source layer are removed from the upper part of the trench using an etchant which is selective to the silicon comprising resist.

5. The method of claim 2, wherein the first conductivity type is p-type, wherein the second conductivity type is n-type, wherein the first dopant source layer comprises a phosphorous-doped silicate glass, and wherein the second dopant source layer comprises a boron-doped silicate glass.

6. The method of claim 2, wherein structuring the photoresist bilayer stack selective to the first dopant source layer comprises:

forming a lithography mask within the photoresist bilayer stack;

patterning the lithography mask into stripes which extend along a first surface of the semiconductor layer at the first side in a direction transverse to the length of the trench, so that regions of the photoresist bilayer stack in the trench are uncovered by the patterned lithography mask; and recessing the regions of the photoresist bilayer stack in the trench uncovered by the patterned lithography mask.

7. The method of claim 2, further comprising:

after the diffusing, removing the first dopant source layer and the second dopant source layer from the trench; and after removing the first dopant source layer and the second dopant source layer from the trench, filling the trench with an electrically conductive material which is in direct contact with the source regions and the body contact regions along the length of the trench.

8. The method of claim 1, wherein diffusing dopants of both conductivity types from oppositely-doped dopant source layers comprises:

forming a first dopant source layer along the sidewall and a bottom of the trench, the first dopant source layer containing a dopant species of the second conductivity type;

forming an etch mask layer on the first dopant source layer, the etch mask layer having a different etch selectivity than the first dopant source layer;

after forming the first dopant source layer and the etch mask layer, filling the trench with a filling material;

structuring the filling material and the etch mask layer selective to the first dopant source layer to expose vertical stripes of the first dopant source layer in an upper part of the trench and which are spaced apart from one another by the structured filling material and the structured etch mask layer along the length of the trench;

removing the structured filling material to expose the etch mask layer in a lower portion of the trench;

after removing the structured filling material, removing the exposed vertical stripes of the first dopant source layer from the upper part of the trench to expose vertical stripes of the trench sidewall;

forming a second dopant source layer in contact with the exposed vertical stripes of the trench sidewall, the second dopant source layer containing a dopant species of the first conductivity type; and diffusing the dopant species of the second conductivity type from the first dopant source layer into first regions of the trench sidewall in contact with the first dopant source layer, and diffusing the dopant species of the first conductivity type from the second dopant source layer into second regions of the trench sidewall in contact with the second dopant source layer.

9. The method of claim 8, wherein the first conductivity type is n-type, wherein the second conductivity type is p-type, wherein the first dopant source layer comprises a boron-doped silicate glass, and wherein the second dopant source layer comprises a phosphorous-doped silicate glass.

10. The method of claim 9, wherein the filling material comprises polysilicon or metal, and wherein the etch mask layer comprises silicon nitride.

11. The method of claim 8, wherein the first conductivity type is p-type, wherein the second conductivity type is n-type, wherein the first dopant source layer comprises a phosphorous-doped silicate glass, and wherein the second dopant source layer comprises a boron-doped silicate glass.

12. The method of claim 8, wherein structuring the filling material and the etch mask layer selective to the first dopant source layer comprises:

forming a lithography mask over a first surface of the semiconductor layer at the first side, the lithography mask covering the filling material and the etch mask layer;

patterning the lithography mask into stripes which extend along the first surface of the semiconductor layer and over the filling material and the etch mask layer in a direction transverse to the length of the trench, so that regions of the filling material and the etch mask layer in the trench are uncovered by the patterned lithography mask; and recessing the regions of the filling material and the etch mask layer in the trench uncovered by the patterned lithography mask.

13. The method of claim 8, further comprising:

after the diffusing, removing the first dopant source layer and the second dopant source layer from the trench; and after removing the first dopant source layer and the second dopant source layer from the trench, filling the trench with an electrically conductive material which is in direct contact with the source regions and the body contact regions along the length of the trench.

14. The method of claim 1, wherein forming the body region comprises:

forming a hard mask with an opening on a first surface of the semiconductor layer at the first side;

etching the drift zone through the opening in the hard mask to form a trench in the drift zone; and filling the trench in the drift zone with an epitaxial material having the second conductivity type.

15. The method of claim 14, wherein the drift zone is etched until reaching an epitaxial layer of the second conductivity type on which the drift zone is formed.

16. The method of claim 14, further comprising:
forming a vertical contact trench which extends through a central part of the epitaxial material and into a doped substrate disposed under the semiconductor layer; and
filling the vertical contact trench with an electrically conductive material which electrically connects the source regions to the doped substrate.

17. The method of claim 1, further comprising:
forming a vertical contact trench which extends through the body region and into a doped substrate of the second conductivity type disposed under the semiconductor layer; and
filling the vertical contact trench with an electrically conductive material which electrically connects the source regions to the doped substrate.

18. The method of claim 1, further comprising:
forming a vertical contact trench which extends through the drain region and into a doped substrate of the first conductivity type disposed under the semiconductor layer; and
filling the vertical contact trench with an electrically conductive material which electrically connects the drain region to the doped substrate.

19. A method of manufacturing a semiconductor device, the method comprising:
forming a semiconductor layer, the semiconductor layer including a drift zone of a first conductivity;
forming a drain region of the first conductivity type in a first side of the semiconductor layer and laterally adjoining the drift zone;
forming a mask with an opening on a first surface of the semiconductor layer at the first side;
etching the drift zone through the opening in the mask to form a trench in the drift zone;
filling the trench with an epitaxial material having the second conductivity type to form a body region which laterally adjoins the drift zone at a side of the drift zone opposite the drain region; and
planarizing the filled epitaxial material.

20. The method of claim 19, wherein the mask is a hard mask.

21. The method of claim 19, further comprising:
forming source regions of the first conductivity type and body contact regions of the second conductivity type in a sidewall of the trench and arranged in an alternating manner along a length of the trench.

22. The method of claim 21, further comprising:
forming a vertical contact structure which extends through the body region or the drain region and into a doped substrate of the first conductivity type disposed under the semiconductor layer, the vertical contact structure electrically connecting the source regions to the doped substrate.

23. The method of claim 19, further comprising:
forming a vertical contact structure which extends through the body region or the drain region and into a doped substrate of the first conductivity type disposed under the semiconductor layer, the vertical contact structure electrically connecting the drain region to the doped substrate.

\* \* \* \* \*